(12) United States Patent
Butler et al.

(10) Patent No.: US 8,446,567 B2
(45) Date of Patent: May 21, 2013

(54) STAGE SYSTEM CALIBRATION METHOD, STAGE SYSTEM AND LITHOGRAPHIC APPARATUS COMPRISING AN ENCODER MEASUREMENT SYSTEM TO MEASURE POSITION OF STAGE SYSTEM

(75) Inventors: Hans Butler, Best (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 943 days.

(21) Appl. No.: 12/418,089

(22) Filed: Apr. 3, 2009

(65) Prior Publication Data

US 2009/0262326 A1 Oct. 22, 2009

Related U.S. Application Data

(60) Provisional application No. 61/071,248, filed on Apr. 18, 2008.

(51) Int. Cl.
G03B 27/58 (2006.01)
(52) U.S. Cl.
USPC .......................................................... 355/72
(58) Field of Classification Search
USPC ............................ 355/72, 73–76, 53; 356/616
See application file for complete search history.

(56) References Cited

U.S. PATENT DOCUMENTS

| 7,573,581 B2 | 8/2009 | Holzapfel |
| 2007/0058173 A1* | 3/2007 | Holzapfel ............... 356/499 |
| 2007/0211237 A1* | 9/2007 | Hsin et al. ............... 355/72 |

FOREIGN PATENT DOCUMENTS

JP    2007-078687 A    3/2007

OTHER PUBLICATIONS

English-Language Abstract of Japanese Patent Publication No. 2007-078687 A, published Mar. 29, 2007; 1 page.
English-Language Translation of Final Notice of Reasons for Rejection directed to related Japanese Patent Application No. 2009-095375, mailed Jun. 29, 2011, Japanese Papent Office; 2 pages.

* cited by examiner

*Primary Examiner* — Toan Ton
*Assistant Examiner* — Chia-how Michael Liu
(74) *Attorney, Agent, or Firm* — Sterne, Kessler, Goldstein & Fox P.L.L.C.

(57) ABSTRACT

A calibration method to calibrate an encoder position measurement system of a stage, the encoder position measurement system including an encoder grid and at least two sensor heads cooperating with the encoder grid, each sensor head providing a sensor head output signal showing a position sensitivity in a horizontal and a vertical direction, the method including a) moving the stage such that the sensor heads are moved with respect to the encoder grid, or vice versa; b) during the moving, measuring the position of the stage with respect to the encoder grid by the two sensor heads; c) determining a vertical position data map from the sensor head output signals of the dual sensor heads; d) calculating a horizontal position data map from the vertical position data map; and e) calibrating the encoder position measurement system applying the calculated horizontal position data map.

19 Claims, 3 Drawing Sheets

STAGE SYSTEM CALIBRATION METHOD, STAGE SYSTEM AND LITHOGRAPHIC APPARATUS COMPRISING AN ENCODER MEASUREMENT SYSTEM TO MEASURE POSITION OF STAGE SYSTEM

CROSS-REFERENCE TO RELATED APPLICATION

The present application claims the benefit of U.S. Provisional Patent Application No. 61/071,248, entitled "Stage System Calibration Method, Stage System and Lithographic Apparatus Comprising Such Stage System", filed on Apr. 18, 2008, which is hereby expressly incorporated by reference in its entirety.

BACKGROUND

1. Field

The present invention relates to a calibration method to calibrate an encoder position measurement system of a stage, to a stage system and to a lithographic apparatus comprising such stage system.

2. Background

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithography, use may be made of an encoder system to measure a position of the stage. Thereto, a grid plate may be provided which is mounted to a reference structure of the lithographic apparatus. Measurements may be taken by sensor heads which are connected to the stage. Use may be made of sensor heads which show a sensitivity in two dimensions, e.g. by interaction of measurement beam having an oblique incidence angle with the grating, thereby providing a single output signal which exhibits a sensitivity to a movement of the stage in both dimensions. By suitably combining (e.g. adding, subtracting) etc. output signals of two of such sensor heads, information can be obtained as to a displacement in the one dimension as well as in the other dimension.

BRIEF SUMMARY

An accuracy of such an encoder position sensor is in part determined by an accuracy and repetition accuracy of a pattern of the grating. In order to reduce errors generated by such inaccuracies of the grating, a calibration may be performed. Thereto, the stage is moved with respect to the grating, e.g. at a constant speed. A low bandwidth controller is applied to control a moving of the stage. The low bandwidth of the controller will cause feedback corrections to make the stage follow an irregularity in the grid to be slow. By measuring an input signal of the low bandwidth controller, information is obtained as to the inaccuracies of the grating in a certain frequency range. This information may then be applied to fill a calibration map.

The calibration however may be prone to disturbances, such as disturbance forces by cables, etc, which are attached to the stage, disturbance forces by cogging effects of a linear motor driving the stage, etc. Using the above calibration technique, grid errors as well as other disturbances will result in inaccuracies of the stage position. Therefore, an accuracy of such calibration may be limited.

It is desirable to provide an accurate of the calibration of the encoder stage position measurement.

According to an embodiment of the invention, there is provided a calibration method to calibrate an encoder position measurement system of a stage, the encoder position measurement system including an encoder grid and at least two sensor heads cooperating with the encoder grid, each sensor head providing a sensor head output signal showing a position sensitivity in a horizontal and a vertical direction, the method including moving the stage such that the sensor heads are moved with respect to the encoder grid, or vice versa; during the moving, measuring the position of the stage using the encoder grid and the sensor heads; c) determining a vertical position data map from the sensor head output signals of the sensor heads; d) calculating a horizontal position data map from the vertical position data map; and e) calibrating the encoder position measurement system based on the calculated horizontal position data map.

In another embodiment of the invention, there is provided a stage system a stage system including a movable stage; a measuring system configured to provide a measurement of a position of the stage, the measuring system including an encoder grid and at least two sensor heads cooperating with the encoder grid, each sensor head providing a sensor head output signal indicating a position sensitivity in a horizontal and a vertical direction; and a controller to control the position of the stage, the controller being configured to determine a vertical position data map from sensor head output signals of the sensor heads; calculate a horizontal position data map from the vertical position data map; and calibrate the measuring system based on the calculated horizontal position data map.

According to a further embodiment of the invention, there is provided a lithographic apparatus including a patterning device support constructed to support a patterning device, the patterning device being capable of imparting a radiation beam with a pattern in its cross-section to form a patterned radiation beam; a substrate support constructed to hold a substrate; a projection system configured to project the patterned radiation beam onto a target portion of the substrate, and a stage system configured to move one of the supports, the stage system including a movable stage; a measuring system configured to provide a measurement of a position of the stage, the measuring system comprising an encoder grid and at least two sensor heads cooperating with the encoder grid, each sensor head providing a sensor head output signal indicating a position sensitivity in a horizontal and a vertical direction; and a controller configured to calibrate the measuring system, the controller being configured to a) determine a vertical position data map from sensor head output signals of the sensor heads; b) calculate a horizontal position data map from the vertical position data map; and c) calibrate the measuring system based on the calculated horizontal position data map.

According to an embodiment of the invention, there is provided a computer product having machine executable instructions, the instructions being executable by a machine to perform a method for calibrating an encoder position measurement system of a stage, the encoder position measurement system comprising an encoder grid and at least two sensor heads cooperating with the encoder grid, each sensor head providing a sensor head output signal indicating a position sensitivity in a horizontal and a vertical direction, the method including moving the stage such that the sensor heads are moved with respect to the encoder grid, or vice versa; during the moving, measuring a position of the stage using the encoder grid and the sensor heads; determining a vertical position data map from sensor head output signals of the sensor heads; calculating a horizontal position data map from the vertical position data map; and calibrating the encoder position measurement system based on the calculated horizontal position data map.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION

Figure 1:
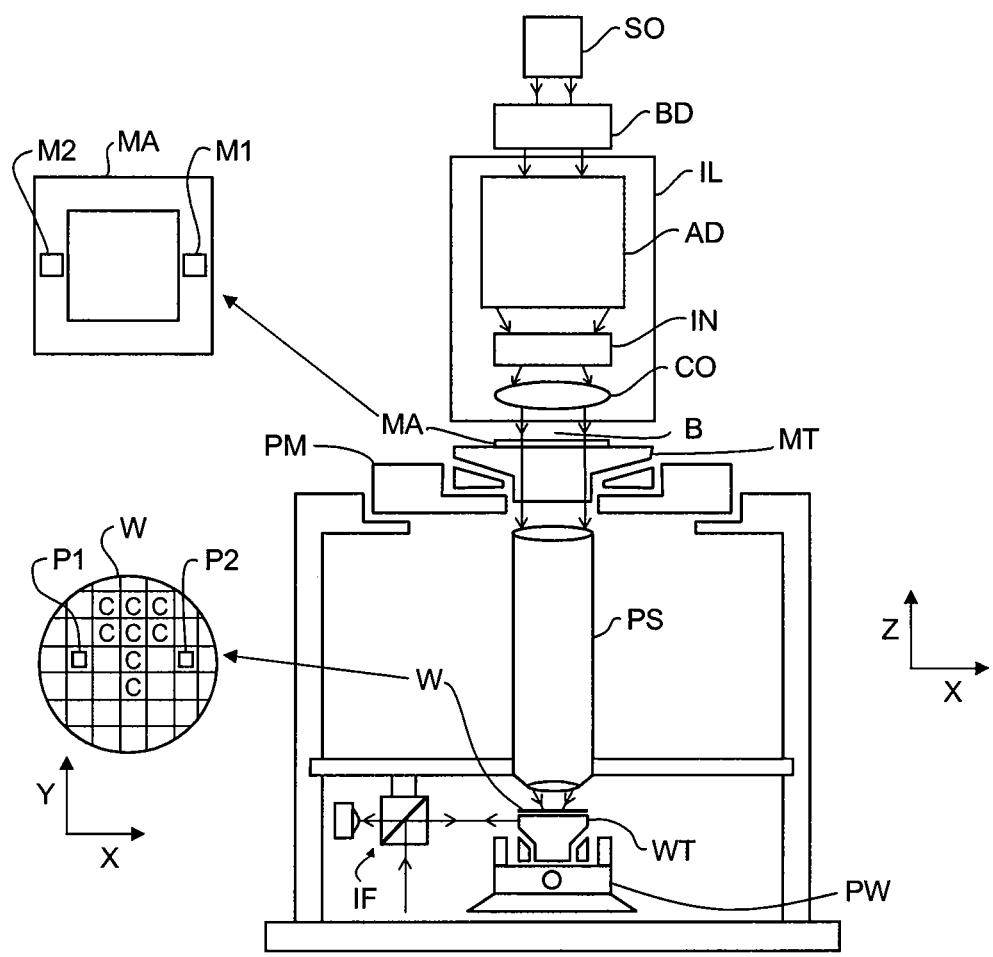
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
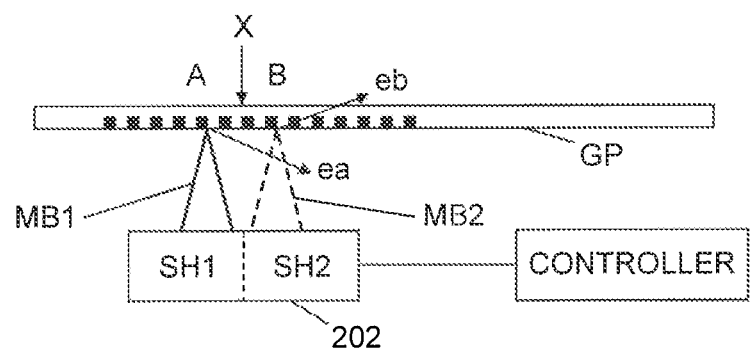
FIG. 2 depicts a schematic side view of an encoder position measurement system onto which the calibration according to an embodiment of the invention may be applied.

FIG. 2 depicts an encoder including two sensor heads SH1, SH2 and a grid plate, the encoder to measure a position of the sensor heads SH1, SH2 with respect to grid plate GP, or vice versa. In this example, an incremental encoder is applied, providing a periodic sensor head output signal when moving the sensor heads with respect to the grid plate. Position information may be obtained from periodicity and phase of corresponding sensor head output signals of the sensor heads. In the embodiment shown, a sensor head assembly 202 is depicted including two sensor heads SH1 and SH2, each emitting a respective measurement beam MB1, MB2 towards the grid plate. Due to an interaction with the pattern on the grid plate (which may be one dimensional or two dimensional), a beam is returned towards the sensor head at an angle, as schematically depicted in FIG. 2, and detected by a suitable detector of the sensor head. Thus, the sensor heads provide for two measurements, namely at A and at B on the grid plate GP. Each of the measurements provides for a sensitivity in horizontal as well as in vertical direction. A sensitivity of the left one of the sensor heads is schematically indicated by vector $e_a$, while a sensitivity of the right one of the sensor heads is schematically indicated by $e_b$. In a present practical implementation, an angle of $e_a$ and $e_b$ with respect to horizontal will be small, smaller than indicated in FIG. 2. In fact, the angles of $e_a$ and $e_b$ with respect to the horizontal plane are exaggerated somewhat for illustrative purposes. A measurement of the horizontal position can now be obtained from an addition of $e_a$ and $e_b$. A measurement of the vertical position can be obtained from a subtraction of $e_a$ and $e_b$, as outlined in the below expressions.

$$e_y = (e_a + e_b)/2$$

$$e_z = (e_a - e_b)/2$$

wherein $e_y$ and $e_z$ represent a respective horizontal and vertical encoder position information.

The encoder as depicted in FIG. 2 may form part of a stage system, such as a substrate stage or a patterning device stage of the lithographic apparatus. Errors in the grid may occur due to many causes, such as irregularities of a surface of the grid, deviations of the pattern, etc. A cause of errors may also be found repetitively: as the pattern of the grid may be provided onto the grid plate by a repetitive process of successive, e.g. identical pattern parts, which manufacturing process may provide a plurality of errors.

In the embodiment of FIG. 2, the sensor heads SH1, SH2 are coupled to the movable stage and the grid plate GP is substantially stationary. However, it will be appreciated that the grid plate GP could be coupled to the stage in another embodiment of the invention. In this latter configuration, the sensor heads SH1, SH2 are stationary.

A calibration may be performed in order to take account of such or other errors. Thereto, the stage is moved with respect to the grating, e.g. at a constant speed. A low bandwidth controller is applied to control a moving of the stage. The low bandwidth of the controller, such as CONTROLLER of FIG. 2, will cause feedback corrections to make the stage follow an irregularity in the grid to be slow. By measuring an input signal of the low bandwidth controller, information is obtained as to the inaccuracies of the grating in a certain frequency range. This information may then be applied to provide a calibration map. In earlier implementations, a horizontal position calibration map (e.g. in y direction) is derived from the above $e_y$ information as obtained from the sum of $e_a$ and $e_b$. According to an embodiment of the invention however, vertical position data is applied to calculate horizontal (Y direction) grid plate errors, as will be explained in more detail below.

When performing the above calibration, grid plate deviations are measured in Y and Z coordinates, as both y and z position information may be derived from the measurements by the two sensor heads. The inventors have however realized that both deviations may be mainly caused by horizontal errors in the gridplate, and not by vertical (flatness) errors. Furthermore, the inventors have realized that because the measurements at A and B are positioned at different locations on the grid plate, a horizontal error that is different in A and B, will end up both in Z and Y. Hence, the Z map may deviate from not zero although the grid plate itself may not have a significant Z error.

Furthermore, the inventors have realized that during the calibration, a signal to noise ratio in a horizontal (Y) direction may deviate from that in a vertical (Z) direction, as the measured Y errors may be more difficult to measure than the Z errors, for two reasons.

Firstly, the horizontal stage behavior may be directionally dependent, in part by cogging effects in a motor, such as a long-stroke motor of the stage that may parasitically influence a short stroke motor of the stage. This effect may be present in the horizontal direction only. Furthermore, disturbance forces on the stage, e.g. by cables or ducts attached to it may be substantially in horizontal direction. Secondly, a sensitivity in Y for noise may be larger than in Z, as the Z sensitivity in the position measurement itself may be larger than in Y, due to the directions of the vectors $e_a$ and $e_b$.

The calibration method according to an embodiment of the invention may be described as a calibration method to calibrate an encoder position measurement system of a stage, the encoder position measurement system including an encoder grid and two sensor heads cooperating with the encoder grid, each sensor head providing a sensor head output signal showing a position sensitivity in a horizontal and a vertical direction, the method including a) moving the stage, thereby moving the two sensor heads relative to the encoder grid; b) during the moving, measuring the position of the stage with respect to the encoder grid by the two sensor heads; c) determining a vertical position data map from the sensor head output signals of the dual sensor heads; d) calculating a horizontal position data map from the vertical position data map; and e) calibrating the encoder position measurement system applying the calculated horizontal position data map. In c), the vertical position data map is determined from the position sensitivity in vertical direction, i.e. from a vertical position information provided by the sensor heads.

It will be appreciated, the calibration method is performed using a controller or control system, such as CONTROLLER of FIG. 2. The controller is operatively coupled to the sensor heads SH1, S2 to perform the calibration. The controller may also include a calculator to determine the position data maps and to execute all the desired procedures (e.g. calculation and control of the sensor heads) to perform the calibration.

Thus, according to an embodiment of the invention, vertical position data is applied to calculate horizontal (Y direction) grid plate errors. As a result, the resulting horizontal calibration may be more accurate as being less sensitive to noise and horizontal scanning effects.

Figure 3:
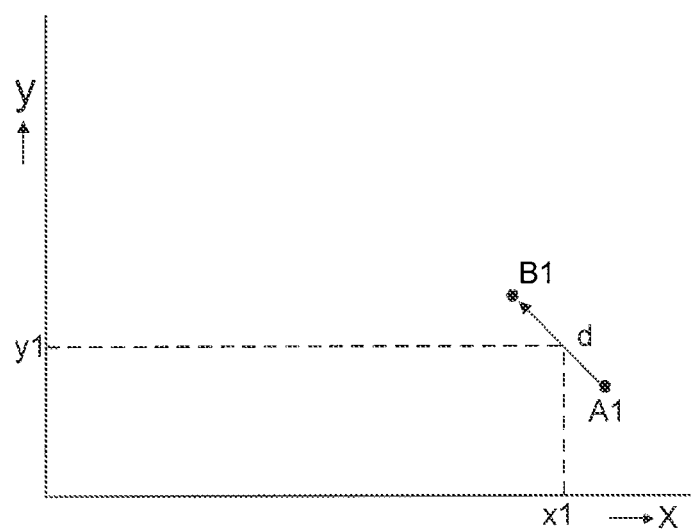
FIG. 3 depicts a schematic top view of measurement point on the grid by the encoder position measurement system according to FIG. 2.

In an embodiment, as illustrated in FIG. 3, when measuring the Y and Z error in position (x1, y1), information is used from spots A1 and B1. Now, when the encoder is shifted from (x1, y1) to (x2, y2) along the line A1-B1, as in the FIG. 4: it can be seen that in position (x1, y1), spot B1 is located in exactly the same place as spot A2, which is related to the measurement in (x2, y2). Hence, if all A measurements are known over the complete grid plate, the B measurements can be easily reconstructed by shifting an A map (containing the A measurements) over a distance d in the direction of B1-A1. In addition, because Z is essentially the difference between A and B, when A1 and Z(x1, y1) are known, B1 (and hence A2) can be calculated. Hence, from the measured Z map and a starting point A1, all A points in line with A1-B1 etc. can be calculated. From this A map, a B map can be calculated by shifting A over a distance d. Combining these A and B maps provides an Y map by essentially adding these.

Calculating Y from Z according to this embodiment includes:

1. Calculating starting values for A in a region at the edges of the plate, by using Y and Z data (this procedure is desirable to create starting values for the following calculations). From these A start values and Z measurement data, calculate the next layer of A values (a distance d further along the diagonal) by using:

$$e_{a2} = e_{b1} = e_{a1} - 2qZ.$$

2. When a complete A map is found this way, a corresponding B map may be created by shifting the A map over a distance d along the diagonal.

3. Calculate the Y map by using:

$$Y = \frac{1}{2p}(e_a + e_b)$$

In the above expressions, p and q are constants taking into account the angle of $e_a$ and $e_b$: An angle $\phi$ of the vector $e_a$ with respect to horizontal may be set to $\phi=py+qz$ As a direction of $e_a$ and $e_b$ is more towards horizontal than towards vertical, p>q. As the sensor heads detect a phase shift in response to a displacement of the grid with respect to the sensor head, p and q may be expressed in radians (rad) per nanometer (nm). In an embodiment, p may be around 1/100 rad/nm while q may be around 1/1000 rad/nm.

The above procedures may be described in that the calibration method according to an embodiment of the invention, d) includes d1) calculating a sensor head measurement value at a starting point from a corresponding vertical position data point in the vertical position data map and an initial horizontal position data point; d2) calculating a following sensor head measurement value from the calculated sensor head measurement value and a corresponding vertical position data in the vertical position data map; d3) repeating d2) for each following sensor head measurement value; and d4) determining a calculated horizontal position data map from the calculated sensor head measurement values.

In an embodiment, d1-d3 are repeated for an opposite direction of calculation, (e.g. in the above example from an upper left corner instead of a lower right), and the calculated horizontal position data maps are averaged thus obtained for the opposite directions. Thereby, a more accurate calibration may be obtained.

Figure 4:
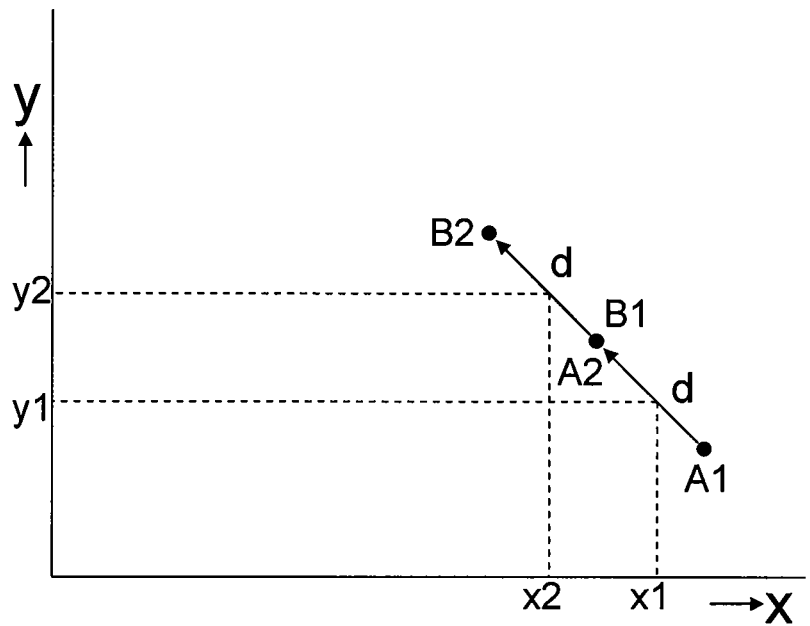
FIG. 4 depicts a schematic representation of successive points at which a calculation step of the calibration according to an embodiment of the invention is performed.

In an embodiment, a low-pass filter may be applied onto the calculated horizontal position data map, in a direction substantially perpendicular to the direction of calculation, i.e. in FIGS. 3 and 4 in a direction substantially perpendicular to line d; which may filter un-useful information thereby improving a calibration accuracy.

Figure 5:
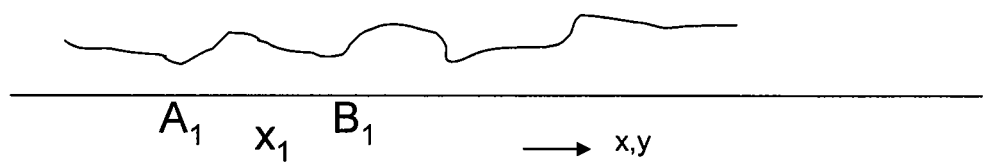
FIG. 5 depicts a graphical representation of encoder measurement results according to an embodiment of the invention.

Another embodiment of the calibration according to the invention will now be described with reference to FIG. 5. FIG. 5 depicts a graphical view of measurement results obtained by the encoder sensor heads, as seen along the line d in FIG. 4. The horizontal axis in FIG. 5 represents points along the line d. The relation between measurement results obtained by the sensor heads can now be expressed as a delay, leading to a filtering equivalent: $A=z^{-d}B$, wherein A and B represent measurements by the sensor heads. Using the formulae for Z and Y, the filtering relation between these can then be written as:

$$\frac{Y}{Z} = \frac{\frac{p}{2}(e_a+e_b)}{\frac{q}{2}(e_a-e_b)} = \frac{p(1+z^{-d})}{q(-1+z^{-d})}$$

It is noted that the delay operator z is dependent on position, in other words forms a 'spatial delay'. Hence, along the diagonal line A-B, Y may be directly calculated from Z using this filter. There is no need to first calculate A and B; however it is desirable to use filter initial conditions to match the measured Y at edges. Analogous to the first method, Y is calculated from Z on a line-by-line basis, and hence additional low-pass filtering may be needed in the perpendicular direction. Note that d may be non-integer, requiring a slightly modified version of this filter:

$$\frac{Y}{Z} = \frac{p(1+(1-\alpha)z^{-l}+\alpha z^{-l-1})}{q(-1+(1-\alpha)z^{-l}+\alpha z^{-l-1})},$$

wherein the delay is expressed as $d=l+\alpha$ with l being an integer.

In a further embodiment of any of the above calibrations, a further horizontal position data map is determined directly from the (horizontal part of the) sensor head output signals of the dual sensor heads as obtained during the moving of the stage, the further horizontal position data map is combined with the calculated horizontal position data map and the calibrating the encoder position measurement system is performed making use of the combined horizontal position data maps. Thereby, an averaging of calibration errors may be provided as the previously applied calibration applying the horizontal position data from the sensor heads is combined with the calibrations as described above wherein the vertical position data is applied to derive the horizontal position there from.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A calibration method to calibrate an encoder position measurement system of a stage, the encoder position measurement system comprising an encoder grid and at least two sensor heads cooperating with the encoder grid, each sensor head providing a sensor head output signal indicating a position sensitivity in a horizontal and a vertical direction, the method comprising:
moving the stage such that at least one of the sensor heads and the encoder grid are moved with respect to each other;
during the moving, measuring a position of the stage using the encoder grid and the sensor heads;
determining a vertical position data map from the sensor head output signals of the sensor heads;
calculating a horizontal position data map from the vertical position data map; and
calibrating the encoder position measurement system based on the calculated horizontal position data map.

2. The calibration method according to claim 1, wherein the position of the stage is controlled by a stage controller, the stage controller being provided a feedback signal with the measured position of the stage, a control loop formed by the stage controller having a low bandwidth to provide a response of the stage which is slow relative to pitch error transients in the encoder grid.

3. The calibration method according to claim 1, wherein the calculating the horizontal position data map comprises:
calculating a sensor head measurement value at a starting point from a corresponding vertical position data point in the vertical position data map and an initial horizontal position data point;
calculating a plurality of subsequent sensor head measurement values from a previously calculated sensor head measurement value, and a corresponding vertical position data in the vertical position data map; and
determining the calculated horizontal position data map from the calculated sensor head measurement values.

4. The calibration method according to claim 3, further comprising:
repeating the calculating the sensor head measurement value and the calculating the plurality of subsequent sensor head measurement values for an opposite direction of calculation in the vertical position data map; and
averaging the calculated horizontal position data maps obtained for the opposite directions.

5. The calibration method according to claim 3, further comprising:
applying a low pass filter on the calculated horizontal position data map, in a direction substantially perpendicular to the direction of calculation in the vertical position data map.

6. The calibration method according to claim 1, wherein calculating the horizontal position data map includes filtering the vertical position data map by a filter to form the horizontal position data map, the filter comprising a spatial delay associated with a spatial distance between the two sensor heads when providing a measurement at a same spot on the encoder grid.

7. The calibration method according to claim 6, further comprising:
applying filter initial conditions to match the horizontal position data map at an edge of the encoder grid.

8. The calibration method according to claim 6, further comprising:
applying a low pass filter on the determined horizontal position data map, in a direction substantially perpendicular to the direction of filtering as applied on the vertical position data map.

9. The calibration method according to claim 1, wherein a further horizontal position data map is determined from the sensor head output signals as obtained during the moving of the stage, the further horizontal position data map is combined with the determined horizontal position data map and the calibrating the encoder position measurement system is performed making use of the combined horizontal position data maps.

10. The calibration method according to claim 1, wherein the determining the vertical position data map includes using vertical position information provided by the sensor heads.

11. A stage system comprising:
a stage;
a measuring system configured to provide a measurement of a position of the stage, the measuring system comprising an encoder grid and at least two sensor heads cooperating with the encoder grid, each sensor head providing a sensor head output signal indicating a position sensitivity in a horizontal and a vertical direction; and
a controller configured to calibrate the measuring system, the controller being configured to:
determine a vertical position data map from sensor head output signals of the sensor heads;
calculate a horizontal position data map from the vertical position data map; and
calibrate the measuring system based on the calculated horizontal position data map.

12. The stage system according to claim 11, wherein the controller is further configured to move the stage such that at least one of the sensor heads and the encoder grid are moved with respect to each other, and, during the moving, control the measuring system to measure a position of the stage using the encoder grid and the sensor heads.

13. A lithographic apparatus comprising:
a patterning device support constructed to support a patterning device, the patterning device being capable of imparting a radiation beam with a pattern in its cross-section to form a patterned radiation beam;
a substrate support constructed to hold a substrate;
a projection system configured to project the patterned radiation beam onto a target portion of the substrate; and
a stage system configured to move one of the supports, the stage system comprising:
a stage;
a measuring system configured to provide a measurement of a position of the stage, the measuring system comprising an encoder grid and at least two sensor heads cooperating with the encoder grid, each sensor head providing a sensor head output signal indicating a position sensitivity in a horizontal and a vertical direction; and
a controller to calibrate the measuring system, the controller being configured to:
determine a vertical position data map from sensor head output signals of the two sensor heads;
calculate a horizontal position data map from the vertical position data map; and
calibrate the measuring system based on the calculated horizontal position data map.

14. The lithographic apparatus according to claim 13, wherein the controller is further configured to move the stage such that at least one of the sensor heads and the encoder grid are moved with respect to each other, and, during the moving, control the measuring system to measure a position of the stage using the encoder grid and the sensor heads.

15. A non-transitory computer readable medium having stored thereon computer-executable instructions, execution of which by a computing device causes the computing device to perform a method for calibrating an encoder position measurement system of a stage, the encoder position measurement system comprising an encoder grid and at least two sensor heads cooperating with the encoder grid, each sensor head providing a sensor head output signal indicating a position sensitivity in a horizontal and a vertical direction, the method comprising:

moving the stage such that at least one of the sensor heads and the encoder grid are moved with respect to each other;

during the moving, measuring a position of the stage using the encoder grid and the sensor heads;

determining a vertical position data map from sensor head output signals of the sensor heads;

calculating a horizontal position data map from the vertical position data map; and calibrating the encoder position measurement system based on the calculated horizontal position data map.

16. The non-transitory computer readable medium according to claim 15, wherein the calculating the horizontal position data map comprises:

calculating a sensor head measurement value at a starting point from a corresponding vertical position data point in the vertical position data map and an initial horizontal position data point;

calculating a plurality of subsequent sensor head measurement values from a previously calculated sensor head measurement value, and a corresponding vertical position data in the vertical position data map; and determining the calculated horizontal position data map from the calculated sensor head measurement values.

17. The non-transitory computer readable medium according to claim 16, further comprising:

repeating the calculating the sensor head measurement value and the calculating the plurality of subsequent sensor head measurement values for an opposite direction of calculation in the vertical position data map; and averaging the calculated horizontal position data maps obtained for the opposite directions.

18. The non-transitory computer readable medium according to claim 16, further comprising:

applying a low pass filter on the calculated horizontal position data map, in a direction substantially perpendicular to the direction of calculation in the vertical position data map.

19. The non-transitory computer readable medium according to claim 16, wherein calculating the horizontal position data map comprises filtering the vertical position data map by a filter to form the horizontal position data map, the filter comprising a spatial delay operator to represent a spatial distance between the two sensor heads when providing a measurement at a same spot on the encoder grid.

* * * * *